(12) United States Patent
Razzell

(10) Patent No.: US 8,103,234 B2
(45) Date of Patent: Jan. 24, 2012

(54) AUTOMATIC GAIN CONTROL USING SIGNAL AND INTERFERENCE POWER TO OBTAIN EXTENDED BLOCKING PERFORMANCE

(75) Inventor: Charles Razzell, Pleasanton, CA (US)

(73) Assignee: NXP B.V., Eindhoven (NL)

( * ) Notice: Subject to any disclaimer, the term of this patent is extended or adjusted under 35 U.S.C. 154(b) by 71 days.

(21) Appl. No.: 12/415,029

(22) Filed: Mar. 31, 2009

(65) Prior Publication Data

US 2009/0185642 A1   Jul. 23, 2009

Related U.S. Application Data

(63) Continuation of application No. 10/535,555, filed as application No. PCT/IB2003/005133 on Nov. 14, 2003, now Pat. No. 7,536,159.

(60) Provisional application No. 60/427,197, filed on Nov. 18, 2002.

(51) Int. Cl.
H04B 7/00 (2006.01)

(52) U.S. Cl. ............... 455/250.1; 455/234.2; 455/245.2; 375/345; 375/346

(58) Field of Classification Search ............... 455/231.1, 455/296, 234.1, 226.2, 567.1, 241.1, 250.1, 455/234.2, 245.2, 253.2, 67.11, 424, 425, 455/456.5, 456.6, 561, 550.1, 575.1, 63.1, 455/226.3, 255, 283, 278.1, 334, 131, 142, 455/183; 375/345, 316, 350, 232, 330, 259, 375/285, 326, 344; 330/254, 278, 129, 279

See application file for complete search history.

(56) References Cited

U.S. PATENT DOCUMENTS

| | | | | |
|---|---|---|---|---|
| 6,512,472 | B1 * | 1/2003 | Smith et al. | 341/155 |
| 6,563,891 | B1 * | 5/2003 | Eriksson et al. | 375/345 |
| 6,625,433 | B1 * | 9/2003 | Poirier et al. | 455/232.1 |
| 6,836,647 | B2 * | 12/2004 | Rimini et al. | 455/226.2 |
| 6,950,641 | B2 * | 9/2005 | Gu | 455/241.1 |
| 7,046,749 | B2 * | 5/2006 | Takatz et al. | 375/345 |
| 7,054,605 | B1 * | 5/2006 | Groe | 455/254 |
| 2001/0053680 | A1 * | 12/2001 | Yamanaka et al. | 455/232.1 |
| 2003/0027538 | A1 * | 2/2003 | Masumoto et al. | 455/234.1 |
| 2003/0078007 | A1 * | 4/2003 | Parssinen et al. | 455/67.1 |
| 2005/0079842 | A1 * | 4/2005 | Shi | 455/232.1 |
| 2005/0208919 | A1 * | 9/2005 | Walker et al. | 455/296 |
| 2006/0222116 | A1 * | 10/2006 | Hughes et al. | 375/345 |

* cited by examiner

*Primary Examiner* — Duc Nguyen
*Assistant Examiner* — Charles Chow

(57) ABSTRACT

In a radio including analog and digital portions, with at least one A/D converter between the analog and digital portions, and the selectivity of the radio at least partly implemented in the digital domain, an AGC controller sets a first variable gain amplifier (VGA) (302) to low gain upon a determination that a wide-band power estimation exceeds a wide-band threshold. The wide-band threshold is selected to reduce the occurrence of A/D converter saturation. If the wide-band power estimation is less than the wide-band threshold, then for each VGA (302) in the analog portion, a determination is made whether a narrow-band power estimate exceeds a narrow-band threshold, corresponding to that VGA (302), plus a hysteresis value, in which case that VGA (302) is set to low gain; or whether the narrow-band energy estimate is less than the narrow-band threshold minus a hysteresis value, in which case that VGA (302) is set to high gain.

5 Claims, 6 Drawing Sheets

```
A1=1; A2=1; A3=1; A4=1;    /* ALL AMPLIFIER GAIN STATES SET TO HIGH GAIN */
T1=-83;      /* THRESHOLD 1, AT -83dBm */
T2=-67;      /* THRESHOLD 2, AT -67dBm */
T3=-51;      /* THRESHOLD 3, AT -51dBm */
T4=-35;      /* THRESHOLD 4, AT -35dBm */
Tw=-28;      /* WIDEBAND OVERLOAD THRESHOLD */
h=-3;        /* HYSTERESIS VALUE */
do {
    Rw=get_wideband_RSSI_measurement (A1, A2, A3, A4);
    Rn=get_narrowband_RSSI_measurement (A1, A2, A3, A4);
    if (Rw > Tw) then
        A1=0;
    else
    {
        /* NORMAL OPERATION */
        If (Rn>T1 + h) A1=0;
        If (Rn<T1 - h) A1=1;
        If (Rn>T2 + h) A2=0;
        If (Rn<T2 - h) A2=1;
        If (Rn>T3 + h) A3=0;
        If (Rn<T3 - h) A3=1;
        If (Rn>T4 + h) A4=0;
        If (Rn<T4 - h) A4=1;
    }
    update_AGC_amplifier_states (A1, A2, A3, A4);
} while (1==1);
```

```
A1=1; A2=1; A3=1; A4=1;        /* ALL AMPLIFIER GAIN STATES SET TO HIGH GAIN */
T1=-83;      /* THRESHOLD 1, AT -83dBm */
T2=-67;      /* THRESHOLD 2, AT -67dBm */
T3=-51;      /* THRESHOLD 3, AT -51dBm */
T4=-35;      /* THRESHOLD 4, AT -35dBm */
Tw=-28;      /* WIDEBAND OVERLOAD THRESHOLD */
h=-3;        /* HYSTERESIS VALUE
do {
        Rw=get_wideband_RSSI_measurement (A1, A2, A3, A4);
        Rn=get_narrowband_RSSI_measurement (A1, A2, A3, A4);
        if (Rw > Tw) then
                A1=0;
        else
        {
                /* NORMAL OPERATION */
                If (Rn>T1 + h) A1=0;
                If (Rn<T1 - h) A1=1;
                If (Rn>T2 + h) A2=0;
                If (Rn<T2 - h) A2=1;
                If (Rn>T3 + h) A3=0;
                If (Rn<T3 - h) A3=1;
                If (Rn>T4 + h) A4=0;
                If (Rn<T4 - h) A4=1;
        }
        update_AGC_amplifier_states (A1, A2, A3, A4);
} while (1==1);
```

FIG. 5

AUTOMATIC GAIN CONTROL USING SIGNAL AND INTERFERENCE POWER TO OBTAIN EXTENDED BLOCKING PERFORMANCE

CROSS-REFERENCE TO RELATED APPLICATIONS

This application is a continuation of application Ser. No. 10/535,555, filed on May 18, 2005, which is the National Stage of International No. PCT/IB2003/005133, filed on Nov. 14, 2003, which is a non provisional application of and claims benefit of U.S. Provisional Application No. 60/427,197, filed on Nov. 18, 2002.

The present invention relates generally to automatic gain control circuitry, and more particularly relates to radio receivers that have channel selectivity functions implemented, at least partly, in the digital domain, and which employ one or more analog-to-digital converters in the signal path.

Traditional radio receiver design implemented the required selectivity functions in the analog domain. Such analog filtering has been in use in radio receivers for many years. More recently, digital signal processing techniques, sometimes referred to as digital filtering, have been developed which are well-suited for implementing various functions in radio receivers which, in the past, were exclusively implemented in the analog domain. However, it will be appreciated that in order to utilize the advantages of digital signal processing, analog signals are converted to digital signals prior to being presented for digital signal processing. It will be further appreciated that a common term for a circuit or system used to convert analog signals to digital signals is analog-to-digital converter (ADC).

Various receiver architectures make use of a combination of analog and digital signal processing. Referring to FIG. 1, a conventional radio receiver architecture which makes use of digital selectivity is shown. In this example of a direct conversion radio receiver, the I and Q (i.e., in-phase and quadrature) signals are converted to a digital format, and subsequent digital signal processing, or filtering, is applied to complete the channel filter response. This is in contrast to older architectures wherein most, it not all, selectivity was performed in the analog domain. These older architectures thus provided excellent protection for the A/D converters because large out-of-band signals had already been filtered out in the analog domain. In this way, out-of-band signal energy was prevented from contributing to the signal amplitude that was presented to the A/D converters.

What is needed are methods and apparatus for reducing or eliminating the signals which exceed the maximum acceptable input level of an analog-to-digital converter in a radio receiver which implements selectivity in the digital domain.

Briefly, embodiments of the present invention provide for improved operation of radio receivers that include analog and digital signal processing portions, with at least one analog-to-digital (A/D) converter disposed between the analog and digital signal processing portions, and wherein the selectivity function of the receiver is, at least partly, implemented in the digital domain. An AGC controller sets a first variable gain amplifier to a low gain state upon a determination that a wide-band signal energy estimation exceeds a wide-band threshold. Such a wide-band threshold is selected so as to reduce, or prevent, the occurrence of saturation of the at least one A/D converter. If the wide-band signal energy estimation is less than the wide-band threshold, then for each of the variable gain amplifiers in the analog portion of the receive signal path, a determination is made as to whether a narrow-band signal energy estimate exceeds a narrow-band threshold, corresponding to that variable gain amplifier, plus a hysteresis value, in which case that variable gain amplifier is set to a low gain state; or whether the narrow-band signal energy estimate is less than the narrow-band threshold minus a hysteresis value, in which case that variable gain amplifier is set to a high gain state.

FIG. 5 is a C language segment illustrating an AGC algorithm in accordance with the present invention.

Figure 1:
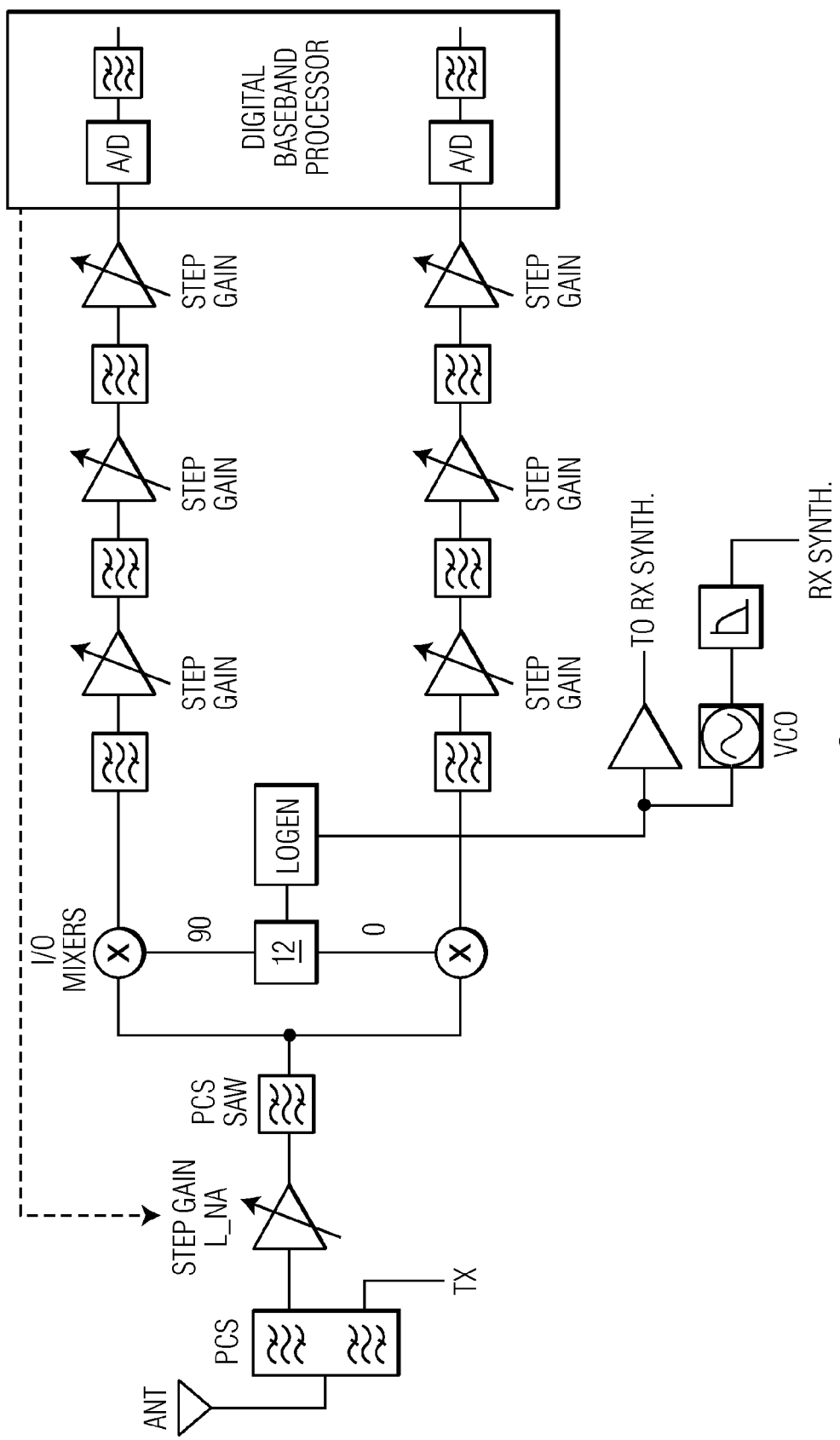
FIG. 1 is a schematic block diagram of radio receiver having both analog and digital portions, and employing digital selectivity.

Methods and apparatus for preventing, or reducing, the occurrence of saturating an A/D converter, which is disposed between an analog portion and a digital portion of a radio receiver, provide for control of one or more variable gain amplifiers based on the total signal energy reaching the A/D converters of the receiver.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

A/D refers to analog-to-digital, as is often used in the context of referring to an A/D converter (ADC).

The acronym AGC refers to automatic gain control.

The acronym ALC refers to automatic level control.

The acronym CDMA refers to code division multiple access.

The acronym ERP refers to effective radiated power.

The acronym PCS refers to personal communication services.

The acronym RSSI refers to received signal strength indicator.

The expression, direct conversion receiver, refers to a radio that converts an incoming signal from a first frequency to a second, desired, frequency in one mixing operation, i.e., without any intermediate frequency (IF) stages.

The present invention relates to radio receivers that have their channel selectivity at least partly implemented in the digital domain, and employ one or more A/D converters in the signal path. In one aspect of the present invention, the total signal power, including out-of-band power, arriving at the input of the A/D converters is maintained within a safe working limit. Such a safe working limit ensures that the signal path is not blocked by strong interferers. In a second aspect of the present invention, digital automatic level control of the fully filtered, on-channel signal provides improved representation of the signal in a given limited word size. Various embodiments of the present invention, which incorporate the aspects mentioned above, are able to provide control of the amplitude of the wanted signal to within well-defined limits. It is noted that the wanted signal is the metric typically used for describing, comparing, or evaluating automatic gain control in an analog portion of a radio receiver.

Conventionally, AGC systems (or subsystems or circuits) are designed to control the level of a desired signal, after channel selectivity has been accomplished. It is therefore a conventional design goal to minimize the impact of off-channel signals on the AGC control loop. It is possible to reproduce this behavior in digital receivers by deriving the AGC power level detection from the output of the final stage of the digital filtering, that is, in the digital baseband. However, enough headroom has to be left "vacant" in the A/D converters to allow the weakly filtered and/or powerful interferers to be handled linearly.

When no attempt is made to control out-of-band power, this power may exceed the linear range of the A/D converters with undesirable consequences for the signal path. Such undesirable consequences may include the catastrophic consequence of all communication being suddenly lost. Embodiments of the present invention overcome this deficiency by ensuring that the total incident power at the A/D converters does not exceed the linear signal handling range of those A/D converters, even if that means sacrificing some signal-to-noise ratio for the wanted signal.

headroom. In various illustrative embodiments of the present invention, the total incident power at the A/D input terminals is between 10 dB to 15 dB below the full-scale input of the A/D converters, thereby providing for headroom. This headroom is intended to allow for the peak-to-mean ratio of the input signals and interferers, with some allowance for delayed reaction through the AGC loop.

Appropriate decimation and channel filters process the signal such that the wanted channel dominates the final signal. At this point some digital automatic level control is applied to fit the most significant non-zero bits of the signal in a limited word size for further processing. Such digital automatic level control provides that the changes in gain, which may be determined by the interferer power rather than the signal power, do not influence the final output of the wanted signal, i.e., the signal that is to be demodulated. Both the feedback gain control state and the feedforward digital automatic level control state are known at all times and can be used to determine the absolute level of the wanted signal, which may be needed for soft decision derivation or path loss estimation in the receiver.

Consider, for example, the signal chain analysis for a direct conversion CDMA receiver operating under conditions of a strong single-tone interferer at 900 MHz. Table 1, below, provides some illustrative signal levels for both the wanted signal and a 900 MHz single-tone interferer.

TABLE 1

| Signal Level (dBm) −101.0 | | | | | | | | | |
|---|---|---|---|---|---|---|---|---|---|
| Single Tone Freq. (+/−kHz) 900 | | | | | | | | | |
| Single Tone Level (dBm) −25.0 | | | | | | | | | |
| Tx Power (dBm) 24.0 | | | | | | | | | |
| | ANT | VGA1 | LPF1 | NULL | LPF2 | NULL | LPF3 | VGA2 | ADC |
| Power/Voltage Gain (dB) | | 16.0 | 10.0 | 0.0 | 10.0 | 0.0 | 0.0 | 12.0 | 0.0 |
| Cascade Power/Voltage Gain (dB) | 0.0 | 33.5 | 43.5 | 43.5 | 53.5 | 53.5 | 53.5 | 65.5 | 65.5 |
| Signal Power (dBm/mV) | −101.0 | 0.189 | 0.6 | 0.6 | 1.9 | 1.9 | 1.9 | 7.5 | 7.5 |
| Single Tone Power (dBm/mV) | −25.0 | 1189.9 | 1189.9 | 1189.9 | 945.2 | 945.2 | 84.2 | 335.4 | 335.4 |
| LNA CrossMod Power (dBm) | | | | | | | | | |
| Total Inband Signal + Noise (mV) | | 0.28 | 0.87 | 0.87 | 2.76 | 2.76 | 2.76 | 10.98 | 10.98 |
| Total Signal + Noise RMS (mV) | | 1190.0 | 1189.9 | 1189.9 | 945.2 | 945.2 | 84.3 | 335.5 | 335.5 |
| Tone Power Ratio (dB) | | 37.6 | 61.5 | 61.5 | 50.3 | 50.3 | 29.7 | 29.7 | 29.7 |
| Total Signal + Noise P2P (mV) | | 3365.8 | 3365.5 | 3365.5 | 2673.3 | 2673.3 | 238.4 | 949.0 | 949.0 |
| Total Inband Noise (dBm/mV) | −112.5 | 0.20 | 0.64 | 0.64 | 2.01 | 2.01 | 2.01 | 8.01 | 8.0 |
| Carrier to Noise Ratio dB | 11.3 | −0.85 | −0.85 | −0.85 | −0.85 | −0.85 | −0.85 | −0.85 | −0.85 |

In an illustrative embodiment of the present invention, the wideband power of the signal at the input to the A/D converters is estimated, and this information is made available as a signal, which is referred to herein as a power signal. For those types of A/D converters that sample directly at the required resolution and sample rate, such a signal may be provided by taking the sums of the squares of digital samples from an in-phase channel and a quadrature channel, and low-pass filtering those sums. In the case of sigma delta A/D converters, it is necessary to perform just sufficient low-pass filtering to prevent the power estimation from being dominated by quantization noise from the 1-bit converter. The bandwidth of the power sense signal, however it may be derived or determined, should be wide enough to cover the frequency band not adequately protected by the partial channel filtering in the analog domain. AGC loop technology (including, but not limited to, conventional AGC loop circuits) is then applied with the aim of keeping the total incident power at the A/D input terminals as high as possible consistent with providing In the illustrative scenario set forth in Table 1, it can be seen that the output signal is 949 mV pp., and that this signal is dominated by the unwanted single-tone power at 335.4 mV r.m.s., compared to the wanted signal at 7.5 mV. Clearly, considerable digital selectivity (about 40 dB) is needed to bring the unwanted tone to a level below the wanted signal. An assumption in this illustrative scenario is that the input to the A/D will saturate at 1 Vpp., and hence the signal chain is just within the limits for this example, which predicts a 949 mV pp., output to the A/D converters. However, if the interferer increases by only 1 dB to −24 dBm, the input to the sigma-delta converter will exceed 1 Vpp., and may clip or become unstable, potentially causing a complete loss of the wanted signal.

Figure 2:
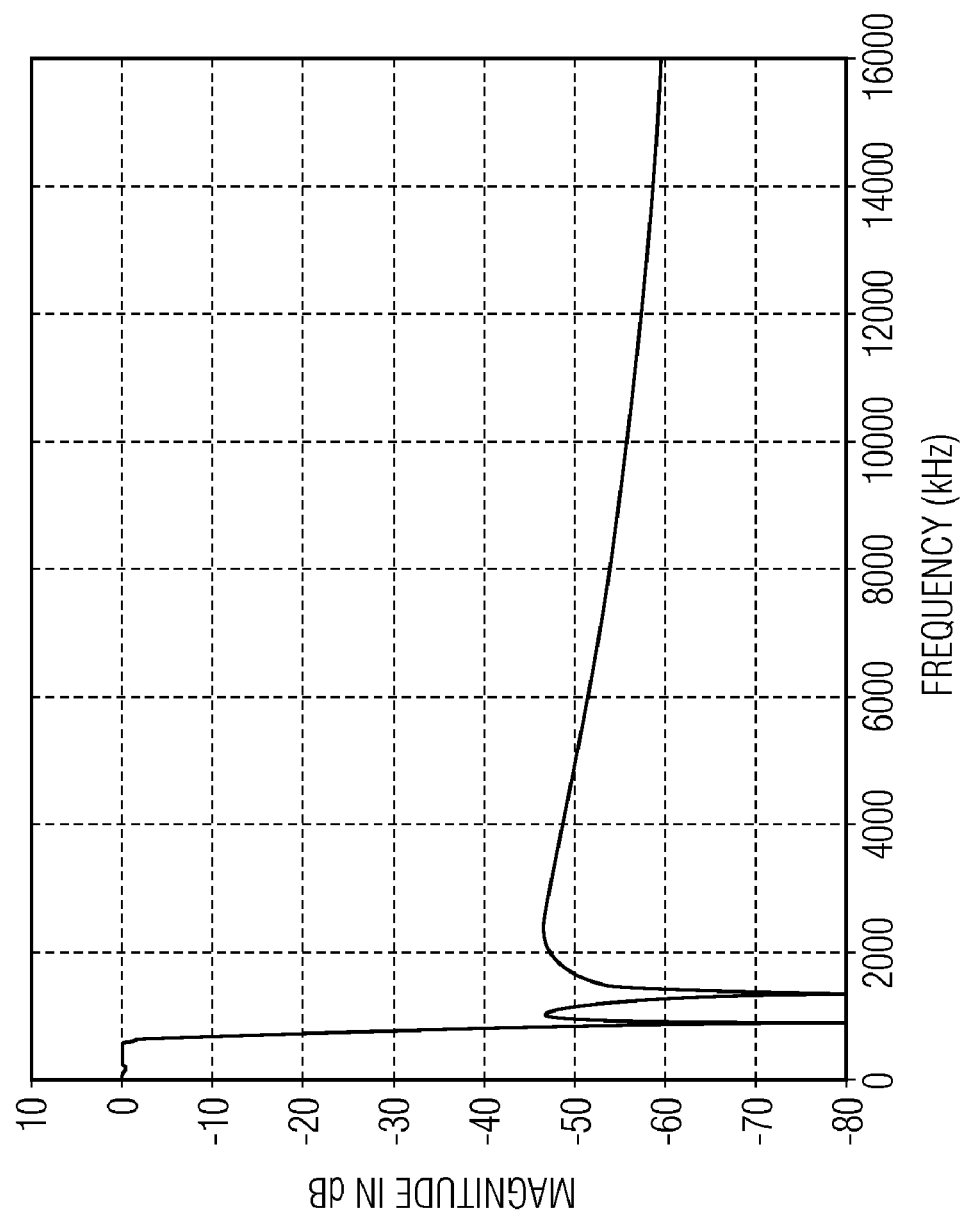
FIG. 2 is frequency versus magnitude diagram of an analog transfer function showing wide-band susceptibility.

Note that the vulnerability described above is not restricted to the 900 kHz offset frequency. Due to the use of an elliptic transfer function in the analog filtering, the out-of-band attenuation is slow to increase with frequency as shown in FIG. 2. As can be seen with reference to FIG. 2, offsets in excess of +/−10 Hz are required to guarantee an extra 10 dB of attenuation.

Consider an unwanted base station transmitter with 30 W ERP, and assuming 0 dBi gain (i.e., 0 dB gain with respect to an isotropic radiation pattern) for the mobile receiver, we can calculate the minimum path loss allowable to result in −25 dBm unwanted received power. Since 30 W is +45 dBm, the total path loss is simply 45±25=70 dB. This kind of path loss is usually associated with close-proximity line-of-sight situations, which can be well approximated by the free space path loss equation:

$$A=20 \log_{10} 4\pi d_0/\lambda$$

Taking $\lambda=3\times10^8/800\times10^6=0.375$ m, and $d_0=100$ m, we obtain $A=70.5$ dB.

This shows that at 800 MHz, there is a blocking zone of approximately 100 m in radius caused by a 30 W transmitter at frequency offsets which do not exceed 10 MHz. At PCS frequencies, the blocking zone can be calculated in a similar fashion to be approximately 40 m in radius.

In the past it has been a common assumption that the AGC signal should be derived exclusively from the power of the wanted signal and should not be influenced, or captured, by off-channel signals. Consistent with this conventional principle, the RSSI signal used to drive the AGC should be derived after the digital filtering by a baseband processor. This principle is illustrated in FIG. 3.

Figure 3:
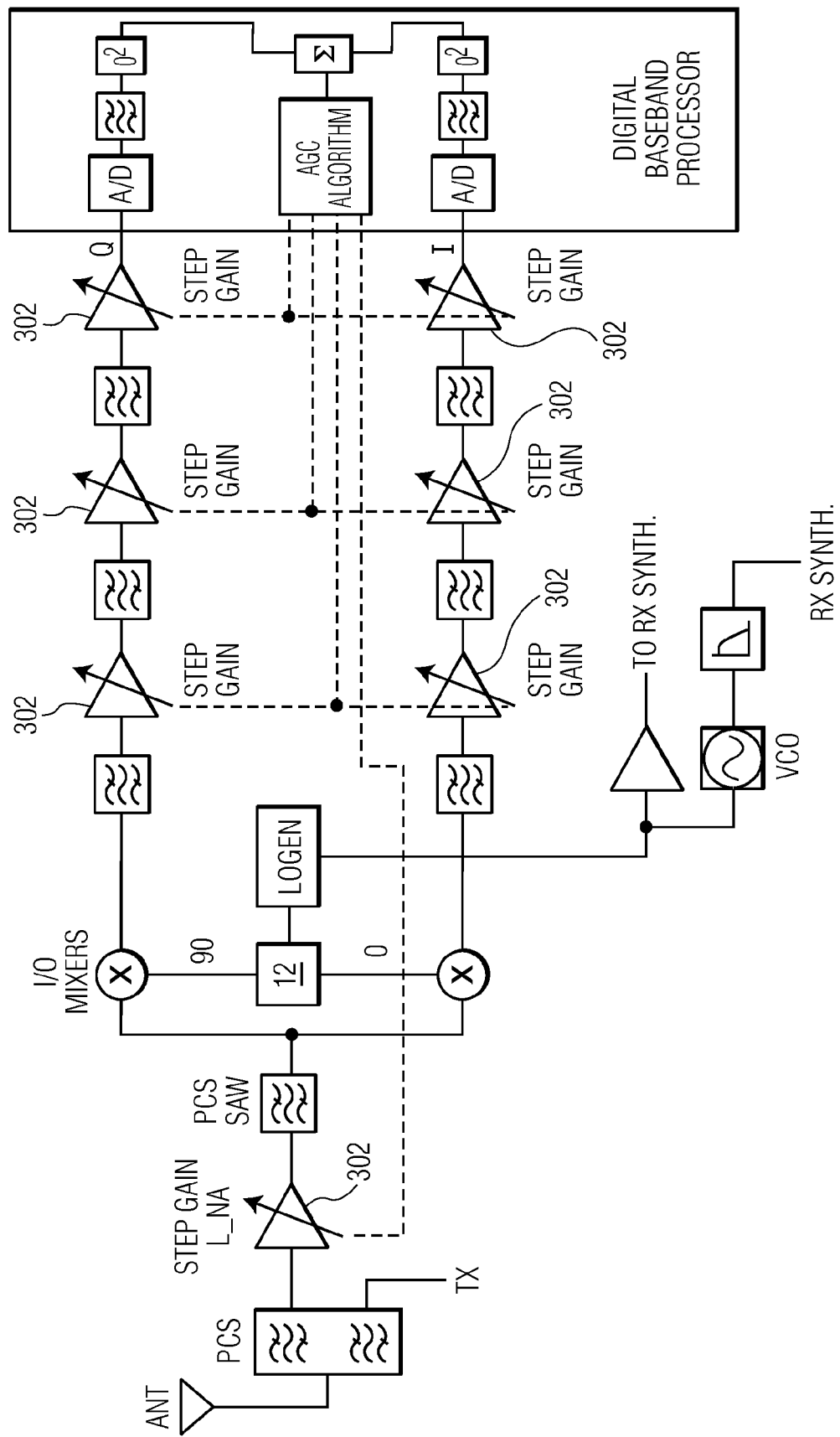
FIG. 3 is a schematic block diagram of radio receiver having both analog and digital portions, employing digital selectivity, and more specifically illustrating automatic gain control derived only from on-channel (i.e., in-band) signal energy.

Referring to FIG. 3, it can be seen that the AGC algorithm is driven by an estimate of the on-channel signal power derived from $I^2+Q^2$. Typically, low-pass filtering and a logarithmic function are applied to create the decision variable used to determine the state of the step gain amplifiers 302. This smoothed logarithmic metric is sometimes referred to as a Received Signal Strength Indicator (RSSI).

However, various performance issues arise from using only the wanted-signal strength in the AGC algorithm of the receiver shown in FIG. 3. More particularly, due to the digital filtering used in the baseband processor, the AGC algorithm is unable to detect out-of-band signals which threaten to exceed an allowable input level of the A/D converters. This vulnerability is likely to manifest itself in an abrupt, and complete, loss of communication once the user (i.e., the receiver) enters a blocking zone, such as those described above. Another potential performance issue, which may arise when using only the wanted signal strength in the AGC algorithm of the receiver, is an unstable condition of the AGC due to in-band energy from distortion products triggering the AGC when in a high-gain state, causing a lower gain setting to be invoked. Once the lower gain setting is invoked, the source of the distortion (e.g., clipping) is removed, causing the high gain state to be invoked again. An oscillation between these two states could therefore occur, thereby effectively disabling the receiver which only uses the wanted-signal strength in its AGC algorithm.

Given the various performance issues which arise from using only the wanted-signal strength in the AGC algorithm of the receiver, various embodiments of the present invention are advantageously designed to avoid capture of the ADC by strong blocking signals. More particularly, various embodiments of the present invention, are designed such that the total signal energy reaching the A/D converters of a receiver does not exceed the maximum allowable input amplitude for stable, linear conversion from analog to digital by those A/D converters.

It is noted that various embodiments of the present invention may use the AGC to implement a scheme wherein the total signal energy reaching the ADC, rather than just the in-band signal power, is used to control gain in the receiver. It is further noted that in such implementations, there is a possibility of a weak wanted-signal being pushed further down into the noise when the AGC, triggered by interference, sets one or more variable gain amplifiers of the receiver to a low gain state. However, it is believed that given the choice between allowing the A/D input to overload and thereby possibly interrupt communication completely, and pushing a weak signal further down into the noise and thereby reduce signal quality, the latter is preferable.

Figure 4:
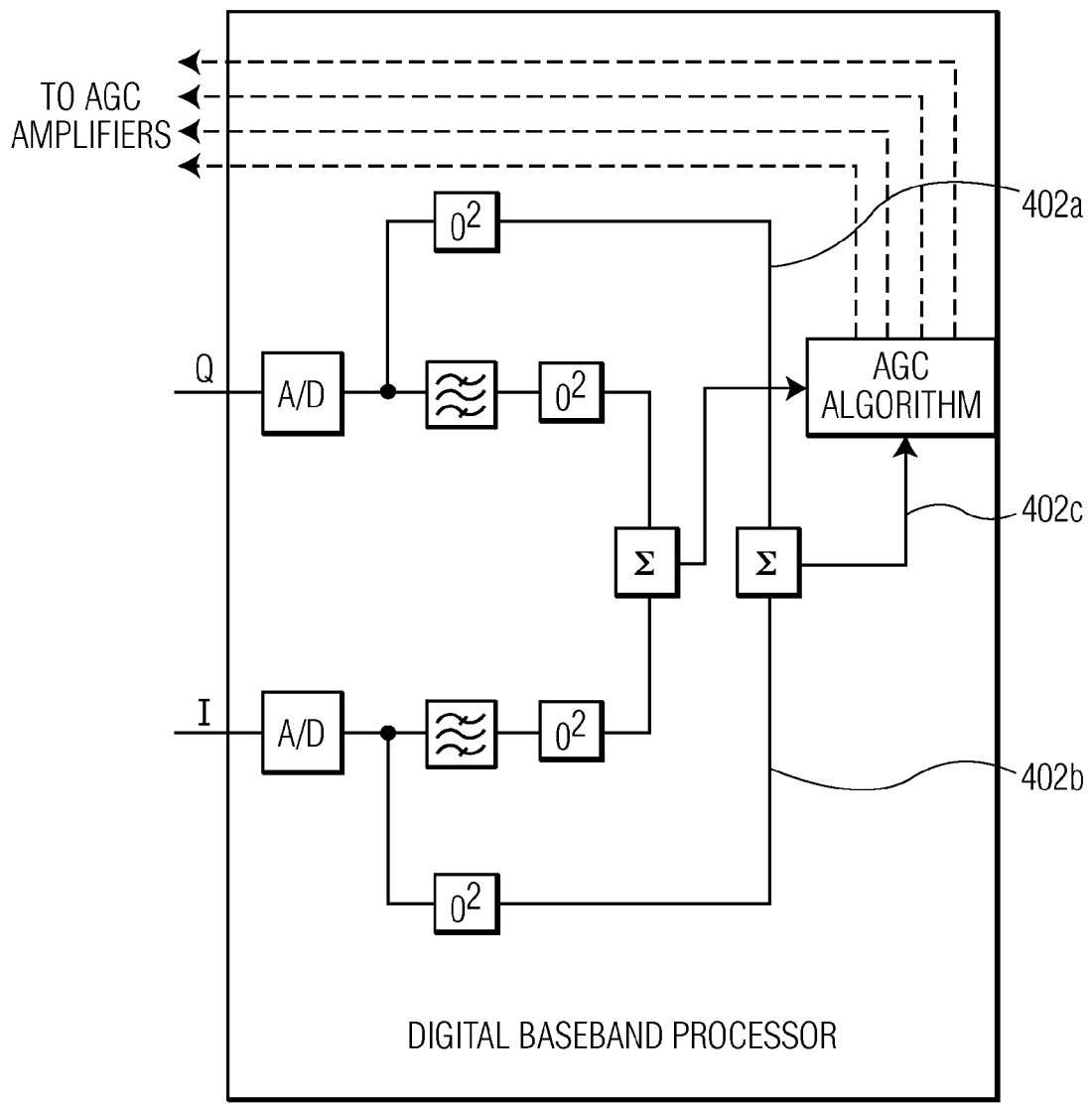
FIG. 4 is a schematic block diagram of a digital portion of a radio receiver showing the additional signal paths used to a achieve a wide-band power estimate in accordance with the present invention.

With respect to various embodiments of the present invention which involve using a digital AGC to avoid large signal overload, the AGC algorithm has access to a wide-band estimate of the signal power incident at the A/D converters. One method of providing this is to take the signal power prior to the digital channel filter and use that to create a supplementary energy estimate. FIG. 4 illustrates the additional signal paths 402a, 402b, and 402c, used to achieve the broadband power estimate in one embodiment of the present invention.

In the illustrative architecture of FIG. 4, the conventional portion of the AGC mechanism is used for the majority of the time. That is, the wanted-signal (which is typically the fully filtered signal) is driving the received signal strength metric which is the basis for the decisions about which of the AGC controlled amplifiers should be in high gain versus low gain states. However, in accordance with the present invention, when the energy from the wide-band signal paths exceeds a certain threshold (typically close to the maximum tolerable signal strength), the AGC algorithm directs the AGC controlled amplifiers to reduce gain accordingly.

FIG. 5 shows a C language code fragment in which an illustrative example of an AGC algorithm in accordance with the present invention is shown. The segment of C language provided in FIG. 5, shows that if the wide-band power estimation exceeds a certain threshold, then the gain setting of the first AGC amplifier is set to low gain mode, irrespective of the narrow-band power estimation.

For the purposes of the illustrative example shown in FIG. 5, it is noted that get_wideband_RSSI_measurement( ) is a function that returns a wide-band RSSI measurement numerically equivalent to the receiver input level in dBm (where dBm is a measurement of power relative to 1 mW) measured without digital channel filtering, and get_narrowband_RSSI_measurement( ) is the equivalent function derived with the use of digital channel filtering. Both of these functions take account of the states of the AGC controlled amplifiers to refer the signal level back to the input of the whole receiver chain.

It is noted that the logic of the AGC processes in accordance with the present invention, may be implemented in hardware, software (or firmware), or a combination of hardware and software. Such software may be executed by conventional microprocessors, microcontrollers, digital signal processors, or by custom designed hardware suitable for executing or otherwise processing said software.

Figure 6:
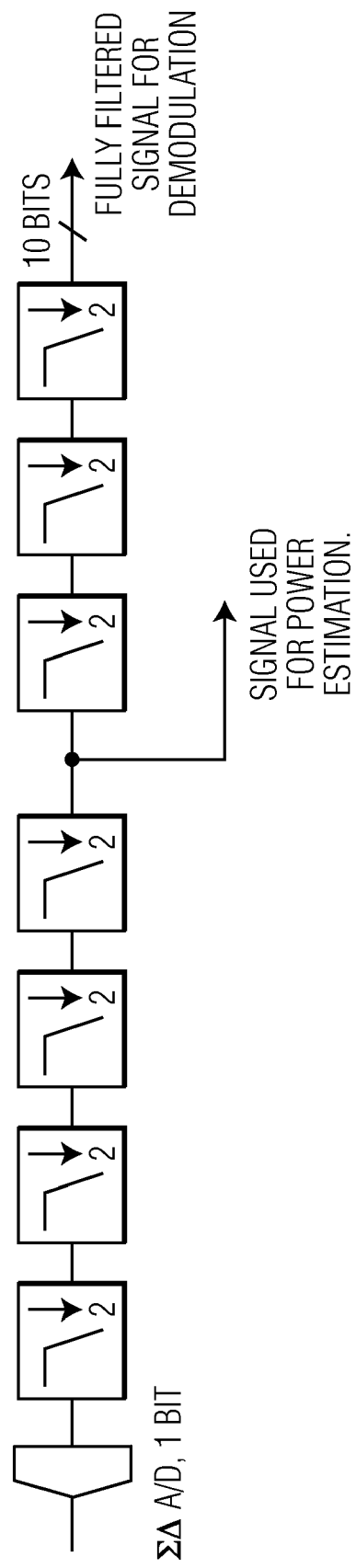
FIG. 6 is a high-level schematic block diagram of one channel of a decimation and filtering scheme, and illustrating access to wide-band signals used for power estimation in accordance with the present invention.

Referring to FIG. 6, a portion of a sigma-delta A/D conversion architecture illustrating access to the wide-band signal used for power estimation is shown. Such sigma-delta A/D conversion architectures provide an opportunity for estimating wide-band power by taking a signal from an intermediate point in the decimation and filtering processing chain. More particularly, FIG. 6 shows one channel of a typical decimation and filtering scheme suitable for use in embodiments of the present invention. Each decimation and filtering stage reduces the bandwidth while increasing the resolution of the signal. Due to noise shaping in the sigma-delta A/D converter, several stages of decimation and filtering are needed to reduce the impact of high frequency quantization noise. Hence a compromise is typically made in choosing a particular point in the decimation chain for power estimation. This trade-off aims to avoid excessive domination by quantization noise, while ensuring sufficient bandwidth for detecting out-of-band interferers.

In various illustrative embodiments described above, two types of power estimation, that is, wide-band and in-band, are used in the AGC algorithms. In an alternative embodiment of the present invention, the complexity of implementation is reduced by only using the wide-band power estimation. In such embodiments the AGC operates only when necessary to prevent overload of the ADC inputs. This does not allow AGC to be used to improve the robustness of the receiver to intermodulation tones, unless those tones were strong enough to trigger an "emergency" reduction in receiver gain to protect the one or more analog-to-digital converters in the receiver. Although this alternative embodiment provides a less complex implementation (because it only uses wide-band power estimation for its AGC process), it does not generally permit sufficiently early operation of the AGC so as to protect the receiver from intermodulation phenomena.

In the various illustrative descriptions provided herein, it has been shown that receivers that include digital signal processing portions, and which rely to a certain extent on digital selectivity, may be vulnerable to large single-tone interferers at offsets between 900 KHz and 10 MHz from the wanted frequency. Conventional AGC schemes, which are driven only by in-band signal power, may fail to react to such an unwanted signal even though it threatens to interrupt communications. An improvement of the AGC architecture, in accordance with the present invention, provides a mechanism to detect such signals when they reach a level that threatens to block the receiver and, responsive thereto, reduces receiver gain so as to protect against that eventuality. In one illustrative embodiment, a signal is taken at an appropriate point in the decimation and filtering chain such that it retains wide-band power information.

Various modifications and alterations may be made within the scope of the present invention, including, for illustrative purposes, but not limited to, providing different hysteresis values for different variable gain amplifiers in the receive signal path, or dynamically assigning various wide-band thresholds, narrow-band thresholds, and/or hysteresis values based upon any suitable factors.

It is to be understood that the present invention is not limited to the embodiments described above, but encompasses any and all embodiments within the scope of the subjoined claims.

The invention claimed is:

1. A method of operating a radio receiver having an analog portion coupled to an A/D converter, and the A/D converter coupled to a digital signal processing portion, the digital signal processing portion using digital filtering to generate a narrow-band signal from a wideband signal received from the A/D converter and to recover data from the narrow-band signal, the method comprising:
    obtaining a wideband signal power estimate of total signal power reaching the A/D converter by measuring a digital signal between the A/D converter and the digital signal processing portion;
    comparing the wideband signal power estimate to a wideband signal power threshold; and
    responsive to comparing the wideband signal power estimate to a wideband signal power threshold, preventing the total signal power reaching the A/D converter from exceeding a maximum allowable input amplitude and,
    wherein preventing the total signal power reaching the A/D converter from exceeding a maximum allowable input amplitude comprises determining that the wide-band signal power estimate is greater than a predetermined first threshold, and, responsive thereto, reducing the gain of at least one amplifier coupled to an input terminal of the A/D converter,
    wherein the A/D converter is a sigma-delta A/D converter that includes a decimation and filtering processing chain and the wideband signal power estimate is obtained by taking a signal from an intermediate point in the decimation and filtering processing chain.

2. The method of claim 1, further comprising detecting an in-band signal power greater than a predetermined second threshold, and, responsive thereto, reducing the gain of at least one amplifier coupled to an input terminal of the A/D converter.

3. A method of operating a radio receiver having an analog input circuit connected to an input of an A/D converter, and a digital signal processing circuit connected to an output of the A/D converter, the method comprising:
    in the analog input circuit, amplifying a received analog radio signal in an amplifier circuit having a gain, and providing the amplified signal to the A/D converter;
    in the A/D converter, converting the analog signal to a wideband digital signal and providing the wideband digital signal to the digital signal processing circuit;
    in the digital signal processing circuit, digitally filtering a narrowband signal from the wideband digital signal;
    determining a wideband signal power estimate based upon the wideband digital signal;
    comparing the wideband signal power estimate to a wideband signal power threshold; and
    responsive to the comparison of the wideband signal power estimate to the wideband signal power threshold, controlling the gain of the amplifier to limit the amplitude of the amplified signal provided to the A/D converter
    wherein controlling the gain of the amplifier includes
        in response to the comparison indicating that the wideband signal power estimate is greater than the wideband signal power threshold, controlling the gain to prevent the total signal power reaching the A/D converter from exceeding a threshold input amplitude, and
        in response to the comparison indicating that the wideband signal power estimate is not greater than the wideband signal power threshold,
            comparing the narrowband signal to a narrowband signal power threshold, and
            controlling the gain of the amplifier circuit in response to the comparison of the narrowband signal power estimate to the narrowband signal power threshold.

4. A method of operating a radio receiver having an analog input circuit connected to an input of an A/D converter, and a digital signal processing circuit connected to an output of the A/D converter, the method comprising:
    in the analog input circuit, amplifying a received analog radio signal in an amplifier circuit having a gain, and providing the amplified signal to the A/D converter;
    in the A/D converter, converting the analog signal to a wideband digital signal and providing the wideband digital signal to the digital signal processing circuit;
    in the digital signal processing circuit, digitally filtering a narrowband signal from the wideband digital signal;
    determining a wideband signal power estimate based upon the wideband digital signal;

comparing the wideband signal power estimate to a wideband signal power threshold; and responsive to the comparison of the wideband signal power estimate to the wideband signal power threshold, controlling the gain of the amplifier to limit the amplitude of the amplified signal provided to the A/D converter wherein amplifying a received analog radio signal in an amplifier circuit having a gain includes amplifying the received analog radio signal in an amplifier circuit having at least two variable-gain amplifiers, each amplifier having a narrowband power threshold associated therewith and each operable in a low gain state and in a high gain state, and controlling the gain of the amplifier includes in response to the comparison indicating that the wideband signal power estimate is greater than the wideband signal power threshold, controlling the gain to prevent the total signal power reaching the A/D converter from exceeding a threshold input amplitude, and in response to the comparison indicating that the wideband signal power estimate is not greater than the wideband signal power threshold, for each amplifier, comparing the narrowband signal to a narrowband signal power threshold for the amplifier, and responsive to the comparison of the narrowband signal power estimate indicating that the narrowband signal power estimate exceeds the narrowband signal power threshold, controlling the gain of the amplifier circuit in the low gain state, and responsive to the comparison of the narrowband signal power estimate indicating that the narrowband signal power estimate does not exceed the narrowband signal power threshold, controlling the gain of the amplifier circuit in the high gain state.

5. A method of operating a radio receiver having an analog input circuit connected to an input of an A/D converter, and a digital signal processing circuit connected to an output of the A/D converter, the method comprising:

in the analog input circuit, amplifying a received analog radio signal in an amplifier circuit having a gain, and providing the amplified signal to the A/D converter;

in the A/D converter, converting the analog signal to a wideband digital signal and providing the wideband digital signal to the digital signal processing circuit;

in the digital signal processing circuit, digitally filtering a narrowband signal from the wideband digital signal;

determining a wideband signal power estimate based upon the wideband digital signal;

comparing the wideband signal power estimate to a wideband signal power threshold; and responsive to the comparison of the wideband signal power estimate to the wideband signal power threshold, controlling the gain of the amplifier to limit the amplitude of the amplified signal provided to the A/D converter wherein amplifying a received analog radio signal in an amplifier circuit having a gain includes amplifying the received analog radio signal in an amplifier circuit having at least two variable-gain amplifiers, each amplifier having a narrowband power threshold associated therewith and each operable in a low gain state and in a high gain state, and controlling the gain of the amplifier includes in response to the comparison indicating that the wideband signal power estimate is greater than the wideband signal power threshold, controlling the gain to prevent the total signal power reaching the A/D converter from exceeding a threshold input amplitude, and in response to the comparison indicating that the wideband signal power estimate is not greater than the wideband signal power threshold, for each amplifier, comparing the narrowband signal to a narrowband signal power threshold for the amplifier, and responsive to the comparison of the narrowband signal power estimate indicating that the narrowband signal power estimate exceeds the narrowband signal power threshold plus a hysteresis value, controlling the gain of the amplifier circuit in the low gain state, and responsive to the comparison of the narrowband signal power estimate indicating that the narrowband signal power estimate is lower than the narrowband signal power threshold minus the hysteresis value, controlling the gain of the amplifier circuit in the high gain state.

\* \* \* \* \*